(12) United States Patent
Fuller et al.

(10) Patent No.: US 10,475,682 B2
(45) Date of Patent: Nov. 12, 2019

(54) WAFER SUPPORT COLUMN WITH INTERLOCKING FEATURES

(71) Applicant: Entegris, Inc., Billerica, MA (US)

(72) Inventors: Matthew Fuller, Colorado Springs, CO (US); Colton Harr, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/751,122

(22) PCT Filed: Aug. 24, 2016

(86) PCT No.: PCT/US2016/048443
§ 371 (c)(1),
(2) Date: Feb. 7, 2018

(87) PCT Pub. No.: WO2017/035256
PCT Pub. Date: Mar. 2, 2017

(65) Prior Publication Data
US 2018/0233390 A1     Aug. 16, 2018

Related U.S. Application Data

(60) Provisional application No. 62/270,388, filed on Dec. 21, 2015, provisional application No. 62/209,771, filed on Aug. 25, 2015.

(51) Int. Cl.
*H01L 21/67*        (2006.01)
*H01L 21/673*       (2006.01)

(52) U.S. Cl.
CPC .............................. *H01L 21/67383* (2013.01)

(58) Field of Classification Search
CPC ........ B65B 31/04; B65D 85/48; B65D 85/86; H01L 21/67; H01L 21/673; H01L 21/67383; H01L 21/677
(Continued)

(56) References Cited

U.S. PATENT DOCUMENTS 5,788,082 A * 8/1998 Nyseth .................... E21B 7/005
                                                    206/454
6,758,339 B2 * 7/2004 Simpson ........... H01L 21/67326
                                                    206/454
(Continued)

FOREIGN PATENT DOCUMENTS

| EP | 1 548 820 A1 | 6/2005 |
| JP | 2005509276 A | 4/2005 |
| JP | 2013038200 A | 2/2013 |

*Primary Examiner* — Bryon P Gehman
(74) *Attorney, Agent, or Firm* — Entegris, Inc.

(57) ABSTRACT

A substrate support assembly for a substrate container. The assembly may include a pair of substrate support columns each including a stack of a plurality of shelf members and a plurality of support rods inserted through the stack for securing the stack together. Each shelf member may include a blade portion having first and second opposing surfaces and an inner and outer periphery. Each surface of the blade portion may include a rib structure and a plurality of bosses positioned towards the outer periphery and extending from a forward portion to a rearward portion of the blade portion. Interlocking features may be defined on the rib structures. The stack of the shelf members may include each shelf member stacked with one or more adjacent shelf members via the rib structures, thereby interlocking each shelf member with the one or more adjacent shelf members via the interlocking features.

20 Claims, 16 Drawing Sheets

(58) Field of Classification Search
USPC .......................................... 206/454, 710, 711
See application file for complete search history.

(56) References Cited

U.S. PATENT DOCUMENTS

| | | | |
|---|---|---|---|
| 6,776,289 B1 * | 8/2004 | Nyseth | H01L 21/67383 |
| | | | 206/454 |
| 7,497,333 B2 * | 3/2009 | Matsutori | H01L 21/67373 |
| | | | 206/454 |
| 8,727,125 B2 * | 5/2014 | Tieben | H01L 21/67379 |
| | | | 206/454 |
| 8,919,563 B2 | 12/2014 | Gregerson et al. | |
| 9,312,157 B2 * | 4/2016 | Adams | H01L 21/67369 |
| 2003/0010672 A1 | 1/2003 | Simpson et al. | |
| 2006/0272974 A1 | 12/2006 | Matsutori et al. | |
| 2008/0121560 A1 | 5/2008 | Tieben et al. | |
| 2014/0238896 A1 | 8/2014 | Huang et al. | |

* cited by examiner

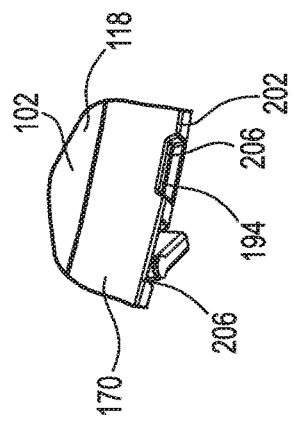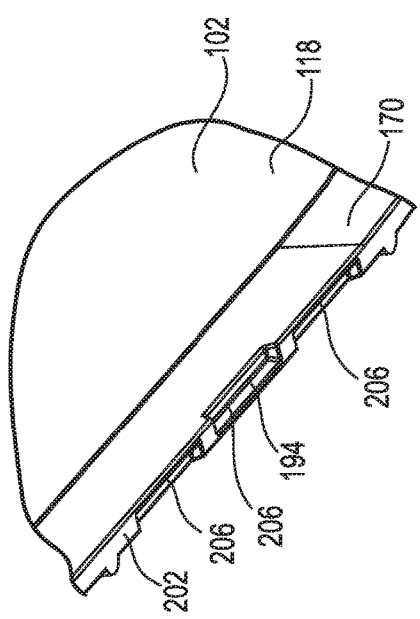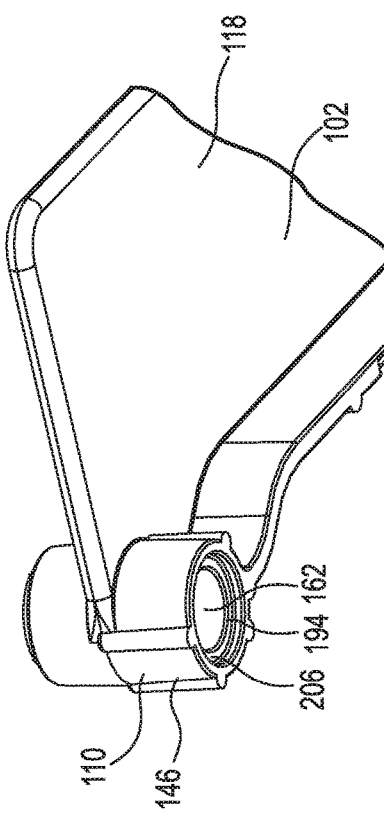

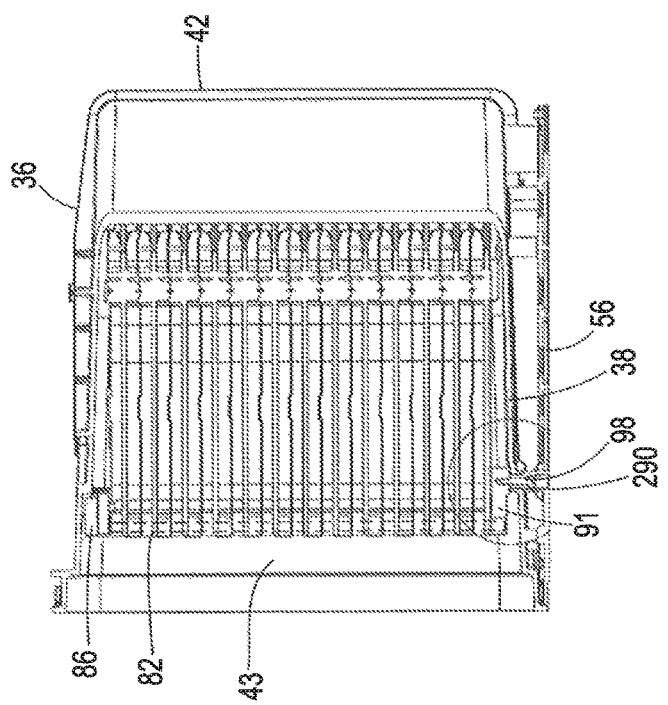
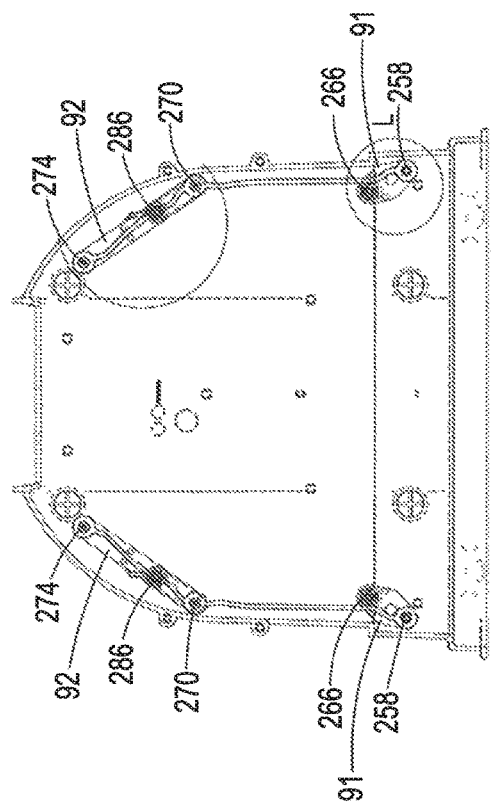
FIG. 15B
FIG. 15C

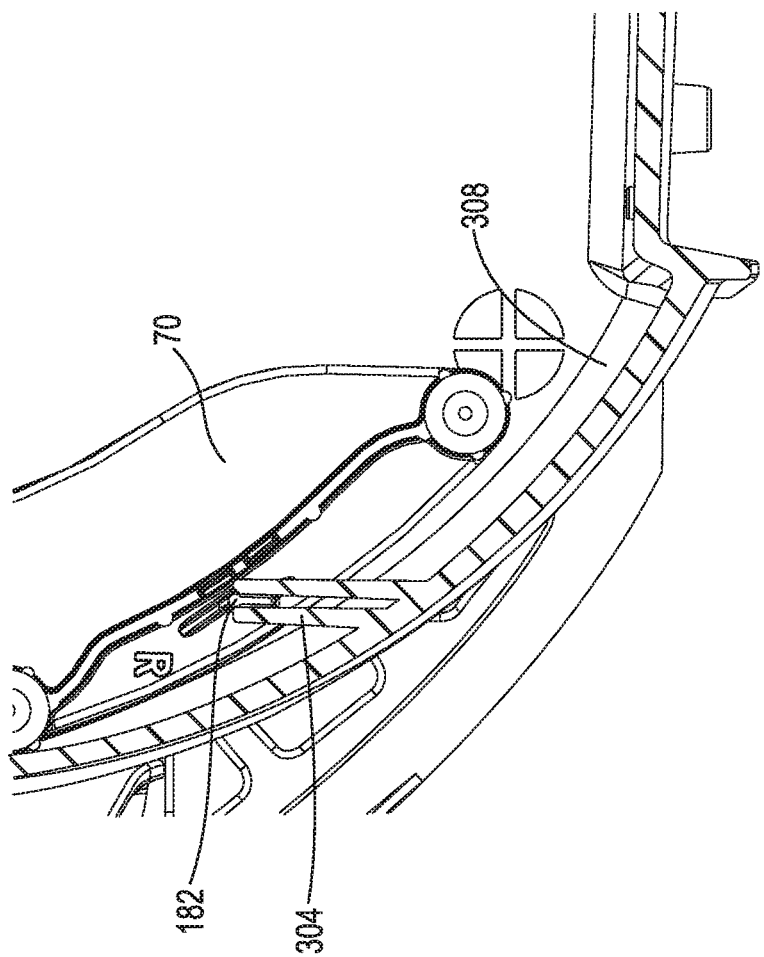

WAFER SUPPORT COLUMN WITH INTERLOCKING FEATURES

RELATED APPLICATIONS

This application claims priority to U.S. Provisional Application No. 62/209,771 filed Aug. 25, 2015 and U.S. Provisional Application No. 62/270,388, filed Dec. 21, 2015, the disclosures of which are incorporated by reference herein in their entireties.

FIELD OF THE DISCLOSURE

The present disclosure relates to semiconductor processing equipment, and more specifically, to containers for semiconductor substrates.

BACKGROUND

With the increased demand for smaller, lower cost, and high performing semiconductor devices, there is an increased demand for smaller and thinner integrated circuits. To achieve these smaller integrated circuits, thin semiconductor substrates or wafers may be used in integrated circuit manufacturing processes.

At various points in the processing of wafers into integrated circuits, the wafers are secured in substrate containers. These substrate containers may support the wafers horizontally, at the underside of the wafers, and at their outer periphery. However, as the wafers become thinner, they tend to increasingly sag when located in such substrate containers due to gravity effects on the increasingly thin structure of the wafers. This sag increases the difficulty of supporting the wafers in the substrate containers and consequently increases the risk of damage to the wafers during processing. Furthermore, the additional sag of the wafers may create interoperability problems with automated processes for handling the wafers. Accordingly, an improved substrate container for handling thin substrates is desirable.

SUMMARY

Various embodiments of the disclosure are mountable in various types of substrate containers. For example, some embodiments of the disclosure include mounting brackets that have offset mounting locations that adapt the support columns to mount within a substrate container that includes attachment locations which are naturally misaligned with the SEMI standard wafer pocket dimensions. This is a different approach from the previous designs, such as in 450 mm substrate containers, where the mounting locations simply coincided with the center axis of each assembly rod. Concepts of 450 mm substrate containers with stackable wafer shelves are illustrated in U.S. Pat. No. 8,919,563, owned by the owner of the instant application, and incorporated by reference herein in its entirety except for patent claims and express definitions contained therein.

Embodiments of the disclosure are directed to a substrate support assembly for supporting thin substrates in a substrate container. In various embodiments, the substrate support assembly includes a pair of modular support columns that each include a plurality of individual shelf members stacked together and secured in place by a plurality of support rods and upper and lower mounting brackets. In various embodiments, each of the support rods are inserted through the stacked shelf members to provide structural support to the support columns. The upper and lower mounting brackets are attached to the top and bottom of each of the support columns for mounting the support columns within the substrate container.

Various embodiments provide a cost effective and configurable modular design for storing thin substrates in various types of substrate containers. For example, embodiments of the disclosure include modular support columns that are assembled by stacking a plurality of individually molded shelf members to create a multiple piece substrate support. In various embodiments, each of the individual shelf members are identical, constructed using the same design. Further, in certain embodiments, each of the shelf members are reversible. As such, the same design is usable for assembling both sides of the substrate support assembly. Additionally, the number of shelves or slots in each support column can be readily varied during assembly based on the number of shelf members used in assembly.

Consequently, the complexity of manufacturing is decreased, replacing the conventional design for a substrate support structure including a plurality of unitary shelves with distinct left side and right side designs. Furthermore, conventional designs must address the practical limitations of injection molding a unitary support structure with deep ribbed shelves suitable for supporting thin substrates. Additionally, conventional designs are costly to manufacture, due the lower volume demand anticipated for this product, and the high cost of producing the injection mold.

According to one or more embodiments, the substrate support assembly includes a pair of substrate support columns each including a stack of a plurality of shelf members and a plurality of support rods inserted through the stack for securing the stack together. Each shelf member may include a blade portion having first and second opposing surfaces and a pair of lengthwise edges extending from a forward portion to a rearward portion. The pair of lengthwise edges may define an outer periphery and an inner periphery for the blade portion.

In various embodiments the blade portion includes first rib structure extending from the first surface and a second rib structure extending from the second surface. The first and second rib structures may be positioned towards the outer periphery of the blade portion and extended from the forward portion to the rearward portion. In some embodiments, the blade portion includes a first plurality of bosses extending from the first surface and a second plurality of bosses extending from the second surface. The first and second plurality of bosses may be positioned towards the outer periphery and may each include a forward boss positioned at the forward portion and a rearward boss positioned at the rearward portion. In one or more embodiments the forward bosses and rearward bosses define a plurality of apertures through the shelf member.

In certain embodiments, the blade portion includes a first group of interlocking features defined on an edge of the first rib structure and a second group of interlocking features defined an edge of the second rib structure. The first group of interlocking features may include projections and the second group of interlocking features may include corresponding recesses for complementary interlocking between the first and second groups of interlocking features.

In one or more embodiments, the stack of the plurality of shelf members includes each of the shelf members stacked with one or more adjacent shelf members via at least one of the first and second rib structures. In various embodiments, the stacking thereby interlocks each shelf member with the one or more adjacent shelf members via at least one of the first and second groups of interlocking features. In some embodiments, the stacking thereby aligns the apertures of the plurality of shelf members and defines a plurality of channels through the stack for insertion of the support rods.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

FIGS. 7A-7F depict partial views of the shelf member of FIG. 4, according to one or more embodiments of the disclosure.

FIG. 15B depicts a cross-sectional view taken at line B-B of FIG. 15A.

FIG. 15C depicts a cross-sectional view taken at line C-C of FIG. 15C.

FIG. 16B depicts a cross-sectional view of a substrate shelf and a tongue and groove feature in a substrate container, according to one or more embodiments of the disclosure.

Figure 1:
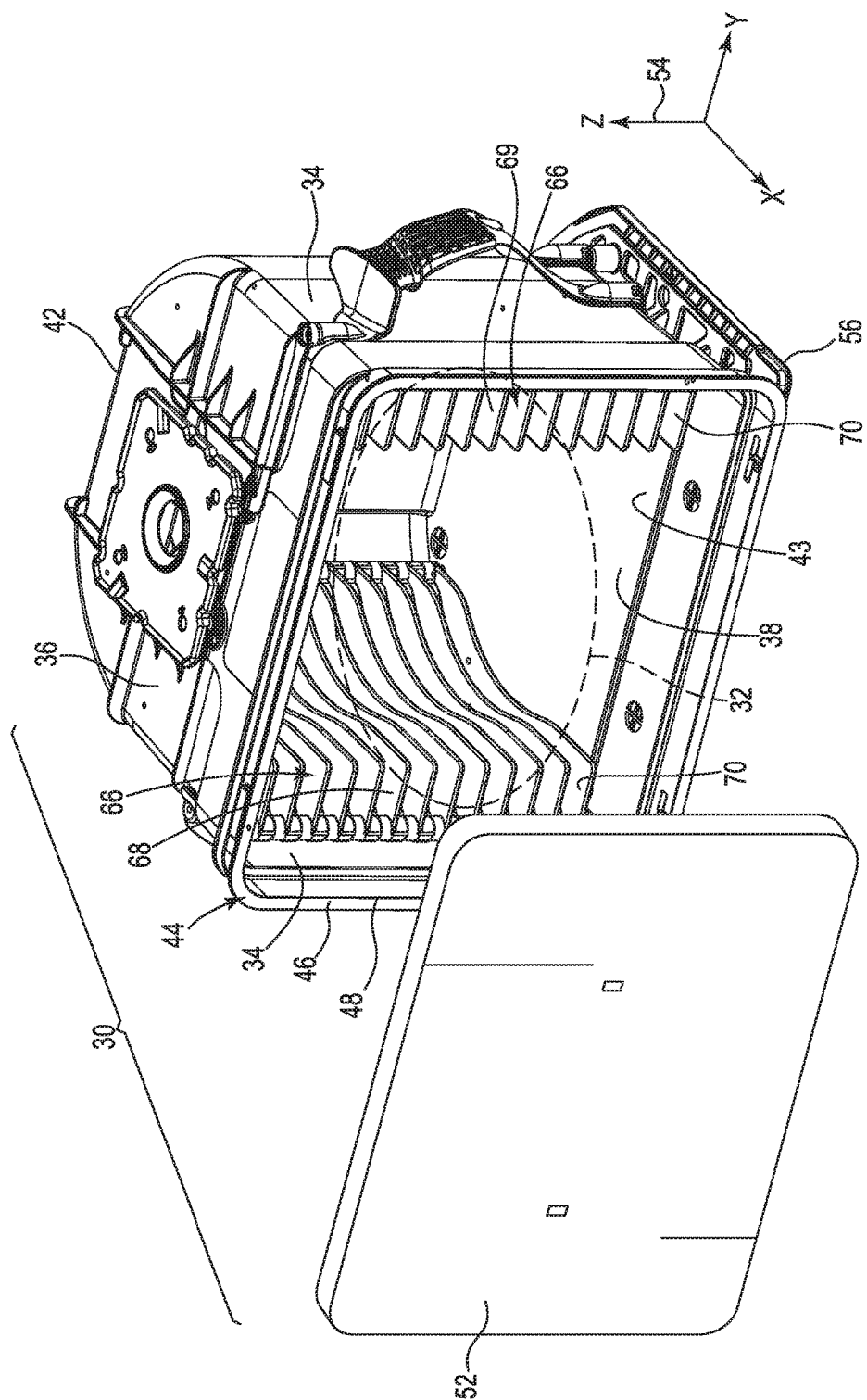
FIG. 1 depicts a substrate container including a substrate support assembly, according to one or more embodiments of the disclosure.

While the embodiments of the disclosure are amenable to various modifications and alternative forms, specifics thereof have been shown by way of example in the drawings and will be described in detail. It should be understood, however, that the intention is not to limit the disclosure to the particular embodiments described. On the contrary, the intention is to cover all modifications, equivalents, and alternatives falling within the spirit and scope of the disclosure.

DETAILED DESCRIPTION

Referring to FIG. 1, a substrate container 30 for storing a plurality of substrates is depicted, according to an embodiment of the disclosure. As used herein, the plurality of substrates include substrates or wafers used in the manufacture of semiconductors, printed circuit boards, flat panel displays, and the like. In certain embodiments, the substrate container 30 includes two opposing side portions 34, a top portion 36, a bottom plate 38 and a back portion 42. The side portions 34, top portion 36, back portion 42, and bottom plate define an interior 43 for the substrate container 30. A front portion 44 of the substrate container 30 includes a door frame 46 that defines a door opening 48 for insertion and removal of substrates 32. A door 52 is adapted to seal and cover the door opening 48. The door opening 48 of the substrate container 30 lies in the facial datum plane or a Z-Y plane that includes axis 54, and is parallel to a vertical or upward direction, indicated by the Z axis. In various embodiments, the substrate container 30 is characterized as containing a microenvironment.

In certain embodiments, the substrate container 30 further includes a conveyor plate 56 positioned below the bottom plate 38. In various embodiments, the conveyor plate 56 is mounted to the bottom of the substrate container 30 for machine based positioning and alignment of the substrate container 30 during various substrate processing steps.

In one or more embodiments, a substrate support assembly 66, including a pair of substrate support columns 68, 69, is disposed within the substrate container 30. In certain embodiments, each of the support columns 68, 69 are proximate a respective one of the side portions 34. The pair of support columns 68, 69 each include a plurality of shelf members 70 which are aligned to define a plurality of slots. Each of the support columns 68, 69 are spaced apart so that substrates, such as substrate 32, may be supported therebetween by the plurality of shelf members 70.

Referring to FIGS. 2-8, the pair of substrate support columns 68, 69 are depicted according to an embodiment of the disclosure. In the depicted embodiment, the substrate support columns 68, 69 include a plurality of stacked shelf members 70 secured together by a plurality of support rods 82 (FIG. 8) that extend through the stacked shelf members 70. Upper and lower brackets 86, 90, caps 94, and fasteners 98 may be attached to the support rods 82. In one or more embodiments, each of the support columns 68, 69 includes a topmost shelf member 99 having an upwardly facing surface 100 and a bottommost shelf member 101 having a downwardly facing surface 103.

In various embodiments, the shelf members 70 each include a blade portion 102 and a plurality of rib structures 106 and bosses 110. In one or more embodiments, the shelf members 70 create upper and lower boundaries, via the stacked blade portions 102, for constraining substrate movement in the Z direction and lateral boundaries, via the rib structures 106 and bosses 110 for constraining substrate movement in the X-Y plane. In certain embodiments, the distance between each adjacent shelf member 70 is equal to the substrate pitch. In some embodiments, the distance between each adjacent shelf member 70 is 20 millimeters (mm). In certain embodiments, the distance between each adjacent shelf member is 10 mm. In one or more embodiments, the distance between each adjacent shelf member 70 is in the range of 10 mm to 20 mm. In various embodiments, the distance between each shelf member can be varied per user requirements. In certain embodiments, the blade portion 102 is substantially parallel to the horizontal datum plane. In some embodiments, the blade portion 102 is set at an angle to the horizontal datum plane to assist in substrate retention in the support columns 68, 69. For example, in some embodiments the blade portion 102 is set at an angle that slopes towards the back 42 of the substrate container 30 (FIG. 1). In some embodiments the angle is between one to four degrees off the horizontal datum plane.

In various embodiments, the bosses 110 of the upwardly facing surface 100 are connected to the upper bracket 86 and the bosses 110 and of the downwardly facing surface 103 are connected to the lower brackets 90. In one or more embodiments, each of the plurality of stacked shelf members 70, brackets 86, 90, and caps 94 are individual components. In some embodiments, the topmost shelf member 99 and the upper bracket 86 are a unitary structure. Similarly, in certain embodiments, and the bottommost shelf member and the lower brackets 90 are a unitary structure. In various embodiments, the shelf members 70 are designed having a mirror image structure such that identical shelf members 70 may be used to assemble both the left support column 69 and right support column 69. For example, a shelf member 70 can simply be rotated or flipped over to configure the shelf member 70 to serve as a left side or right side shelf.

In various embodiments, the shelf members 70 may be constructed using various materials including, but not limited to, polymers, elastomers, metal, or other suitable material. The members may be injection molded, insert molded, overmolded, or manufactured using various suitable molding processes.

As depicted in FIGS. 3-6, the blade portion 102 may have a substantially planar shape with first and second opposing surfaces 114, 118, and lengthwise edges 122 extending from a forward portion 126 to a rearward portion 130. In various embodiments, the lengthwise edges 122 define an outer periphery 134 and an inner periphery 138. In various embodiments, the outer and inner peripheries 134, 138 are curved or arcuate, having a shape that generally conforms with the interior sidewalls 34 of the substrate container 30 (FIG. 1). In some embodiments, the blade portion 102 additionally includes pads or bumps (not depicted) on the first and second surfaces 114, 118 for spacing the substrate from the blade surface 114, 118.

Figure 5:
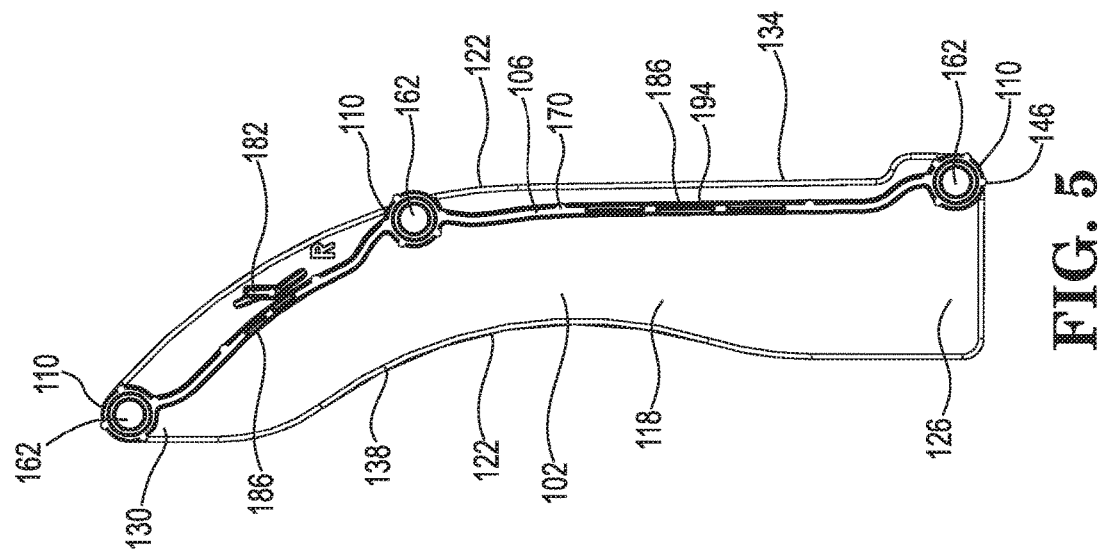
FIG. 5 depicts a second plan view of the shelf member of FIG. 4, according to one or more embodiments of the disclosure.
Figure 4:
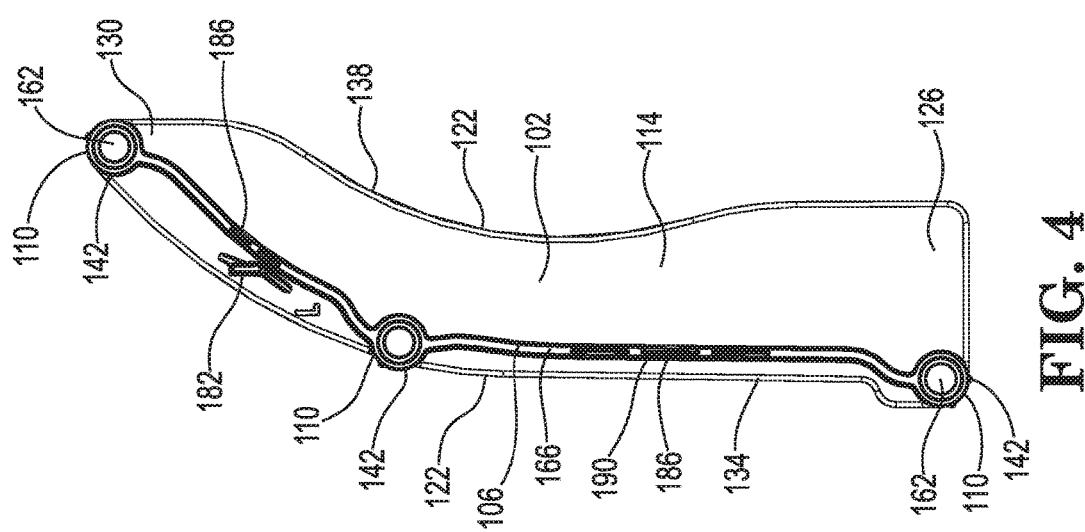
FIG. 4 depicts a first plan view of a shelf member, according to one or more embodiments of the disclosure.

In one or more embodiments, each of the shelf members include a plurality of bosses 110 and rib structures 106. For example, the blade portion 102 may have a first group of bosses 142 extending from the first surface 114 and a second group of bosses 146 extending from the second surface 118 (FIGS. 4 and 5).

In various embodiments, the plurality of bosses 110 are circular studs or protuberances positioned at various positions along the outer periphery 134 of the blade portion 102. For example, in some embodiments, the blade portion 102 includes a forward boss 150 positioned at the forward portion 126 and a rearward boss 154 positioned at the rearward portion 130. In certain embodiments, the first and second group of bosses 142, 146 each include one or more intermediate bosses 158 positioned between the forward boss 150 and the rearward boss 154 and along the outer periphery 134.

In various embodiments, each of the plurality of bosses 110 define apertures 162 through the shelf member 70. For example, the forward bosses 150 on the first and second surfaces 114, 118 define an aperture 162 at the forward portion 134. Similarly, the rearward bosses 154 on the first and second surfaces 114, 118 define an aperture 162 at the rearward portion 130.

In one or more embodiments, the rib structure 106 of the shelf member 70 includes a first rib structure 166 extending from the first surface 114 and a second rib structure 170 extending from the second surface 118. Thus, the rib structure 106 is a raised rib or portion of material on the first and second surfaces 114, 118.

In one or more embodiments, the first and second rib structures 166, 170 extend proximate the outer periphery 134 from the forward portion 126 to the rearward portion 130. In some embodiments, the rib structure 106 extends between each of the plurality of bosses 110 in the shelf member 70. For example, depicted in FIG. 3, the rib structure 106 may include a first portion 174 extending between the forward boss 150 and the intermediate boss 158, and a second portion 178 extending between the intermediate boss 158 and the rearward boss 154.

In some embodiments, the shelf member 70 includes an alignment feature 182. In various embodiments the alignment feature 182 is a raised rib of material extending from the first and second surface 114, 118. The alignment feature 182 may be positioned between the rib structure 106 and the outer periphery 134. In some embodiments, the alignment feature 182 is positioned generally towards the rearward portion 130 of the blade portion 102. In some embodiments, the alignment feature 182 engages with structural elements of the substrate container 30 (FIG. 1), such as a tongue and groove feature, for alignment of the support columns 68, 69 within the container 30.

In one or more embodiments, the shelf member 70 includes interlocking features 186 extending from the first and second surfaces 114, 118 of the blade portion 102. For example, a first group 190 of interlocking features 186 may extend from the first surface 114 via the first rib structure 166 and the first group 142 of bosses 110. Similarly, a second group 194 of interlocking features 186 may extend from the second surface 118 via the second rib structure 170 and the second group 146 of bosses 110.

Figure 6:
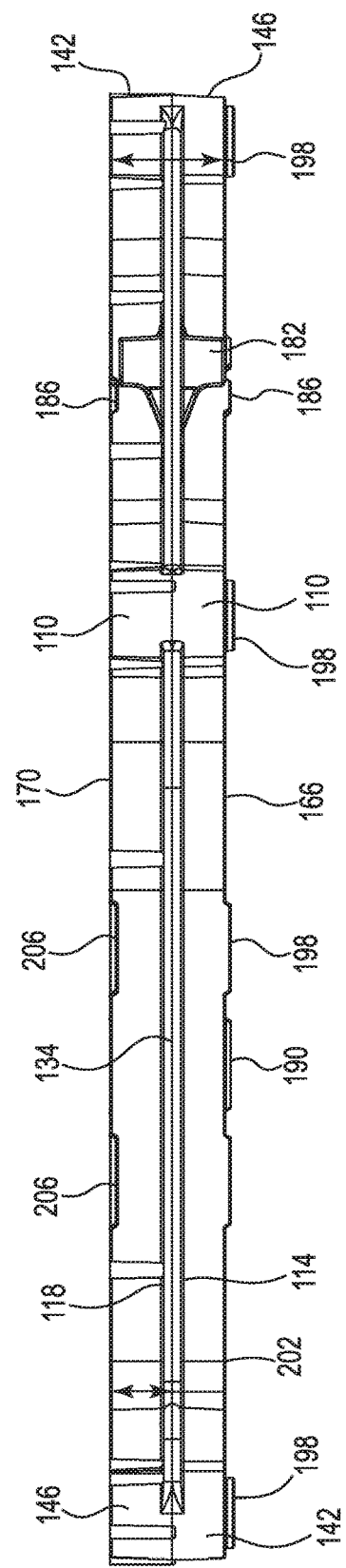
FIG. 6 depicts a side elevational view of the shelf member of FIG. 4, according to one or more embodiments of the disclosure.
Figure 7B:
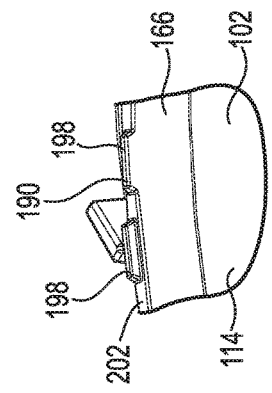
Figure 7A:
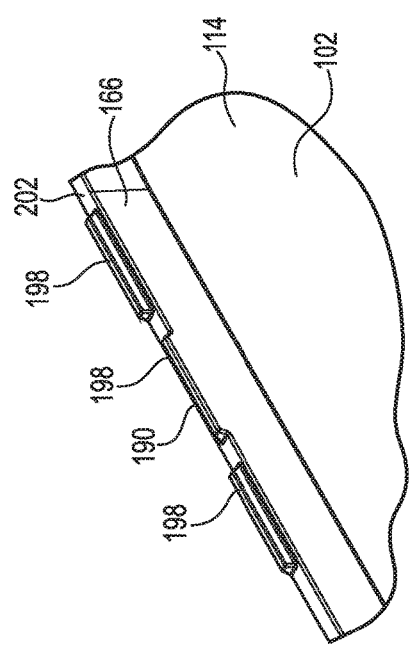
Figure 7C:
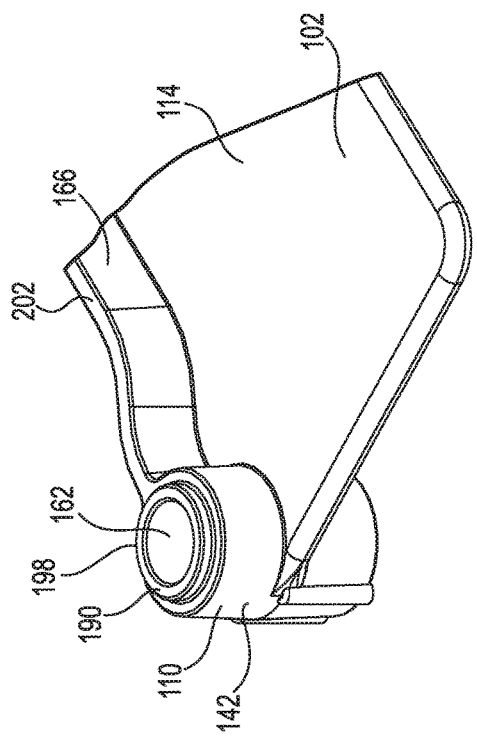
Figure 8:
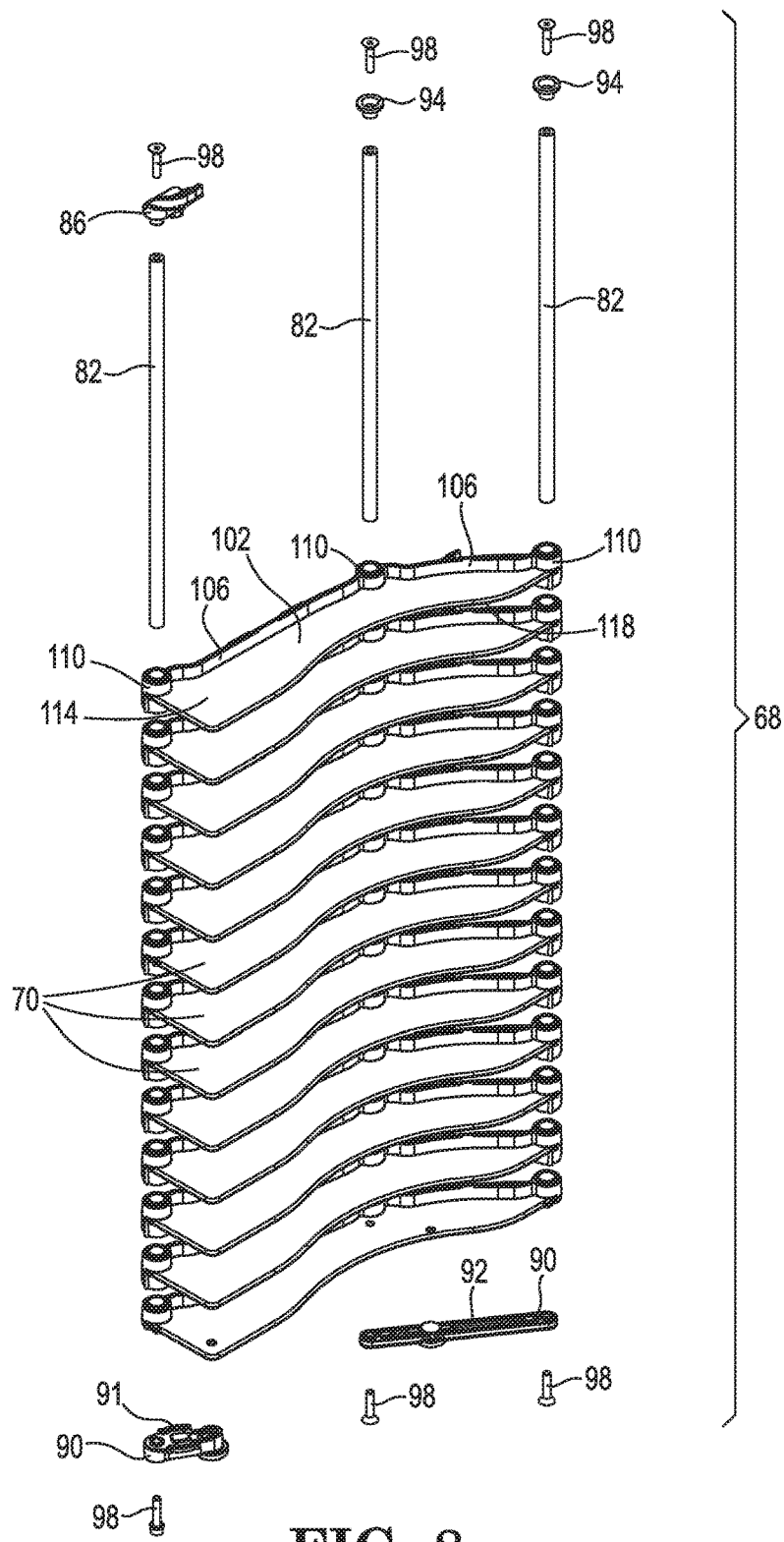
FIG. 8 depicts an exploded view of a substrate support column, according to one or more embodiments of the disclosure.
Figure 9:
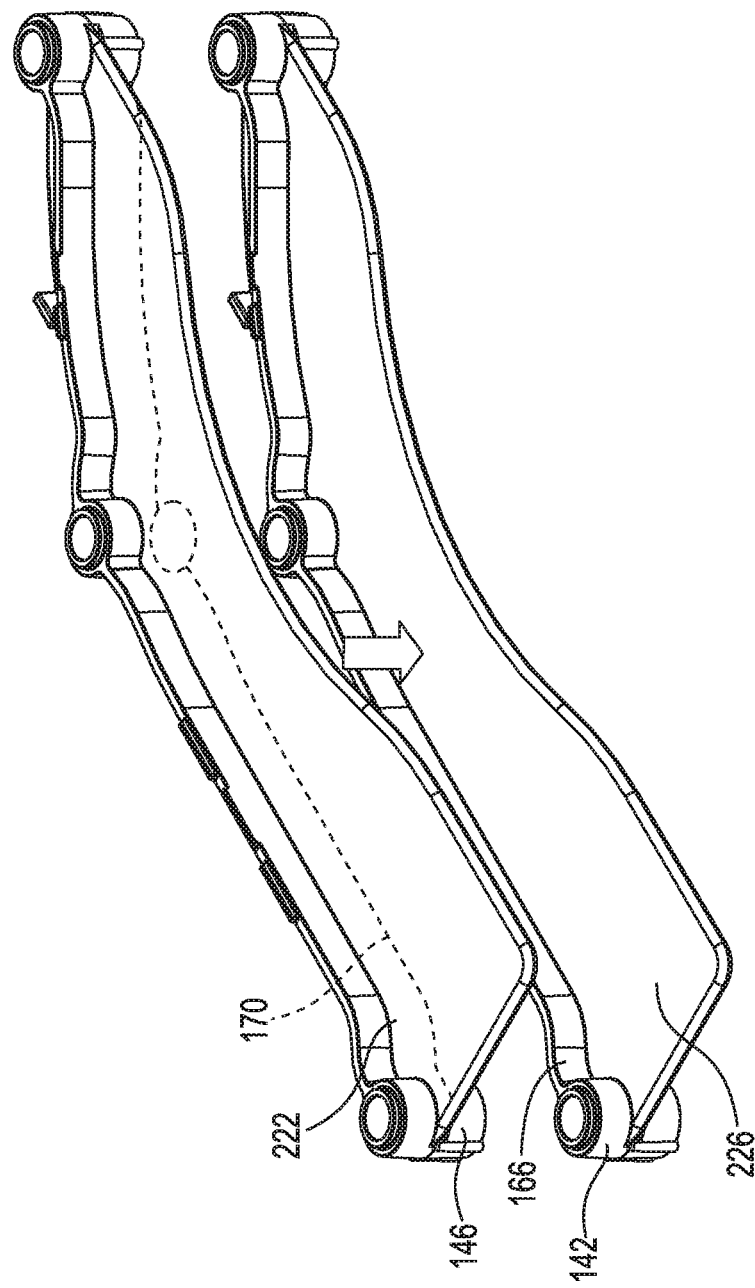
FIG. 9 depicts a perspective view of a plurality of shelf members, according to one or more embodiments of the disclosure.
Figure 10:
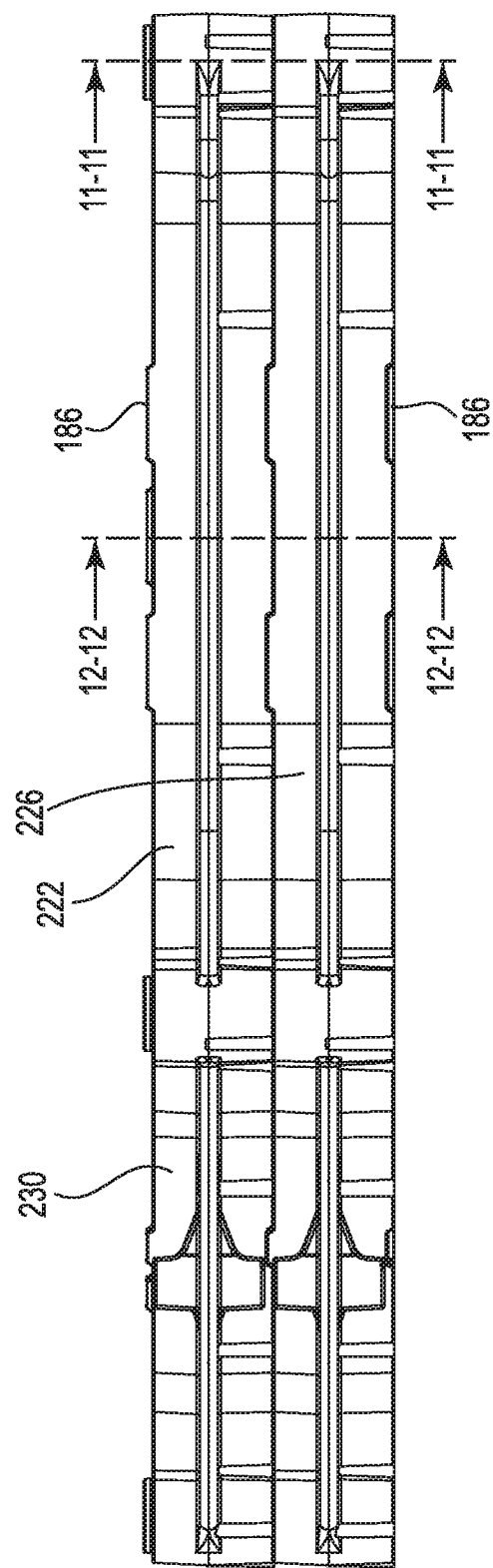
FIG. 10 depicts a side elevational view of a stack of shelf members, according to one or more embodiments of the disclosure.

Depicted at least in FIGS. 6-7F, in various embodiments, the first and second groups 190, 194 of interlocking features 186 are complementary with one another, configured for mating or fitting together by overlapping or fitting together with projections and corresponding recesses. For example, in FIGS. 7A-7C, the first group 190 of interlocking features 186 are depicted. The first group 190 includes a plurality of projections 198 extending from the first rib structure 166 and from the first group of bosses 142. For example, the first rib structure 166 includes a plurality of rib shaped projections 198 extending from an edge 202 of the first rib structure 166. The first group of bosses 142 includes an annular shaped projection 198 surrounding aperture 162.

Similarly, as depicted in FIGS. 7D-7F the second group 194 of interlocking features 186 includes a plurality of recesses 206 having a shape corresponding with the shape of the plurality of projections 198 in the first group 190 of interlocking features 186. For example, the second rib structure 170 includes a plurality of rib shaped recesses 206 in the edge 202 of the second rib structure 170. The second group of bosses 146 includes an annular recess 206 surrounding aperture 162. In one or more embodiments, the interlocking rib structures 166, 170 resist lateral movement between individual shelf members 70.

Figure 2:
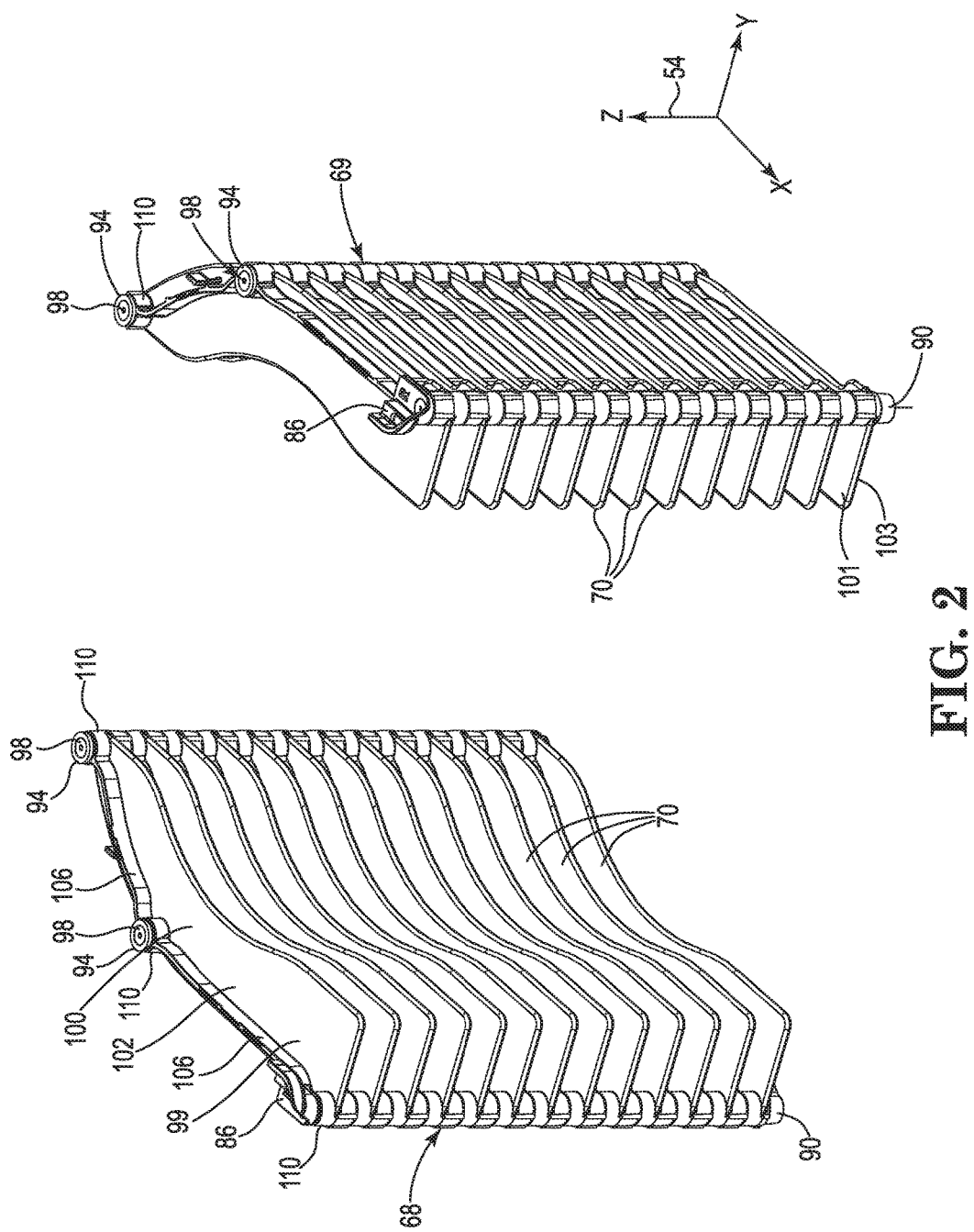
FIG. 2 depicts a perspective view of a pair of complementary substrate support columns, according to one or more embodiments of the disclosure.
Figure 3:
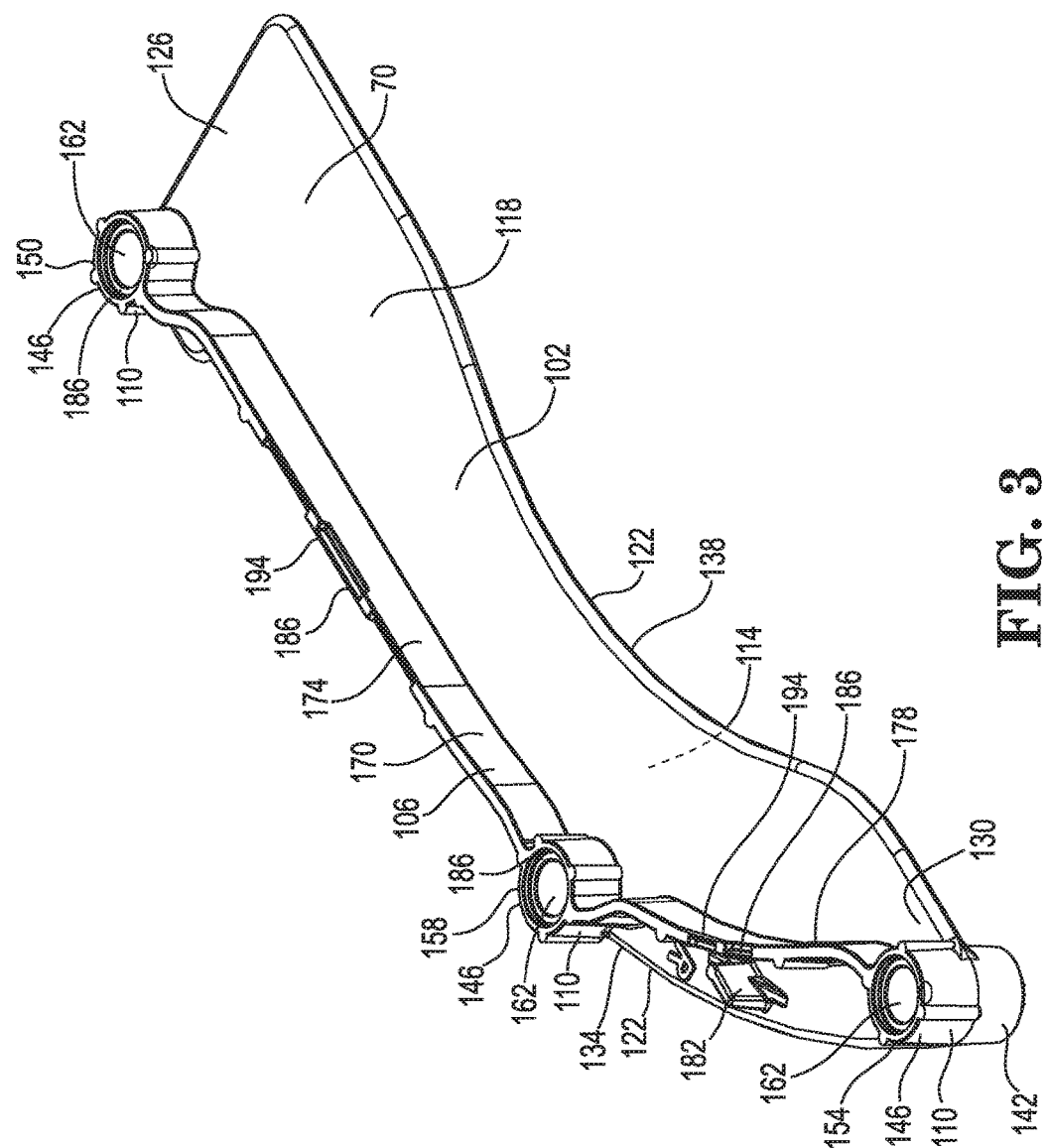
FIG. 3 depicts a perspective view of a shelf member, according to one or more embodiments of the disclosure.

Referring to FIGS. 8-12, in assembly, the plurality of shelf members 70 may be stacked upon one another to form the support columns 68, 69 (FIG. 2). In some embodiments, each shelf member 70 is stacked onto the plurality of support rods 82. In certain embodiments, once the shelf members 70 are stacked, the support rods 82 may be inserted through the stack, via apertures 162 in each of the bosses 110. In various embodiments, the fit to the support rods 82 can be a clearance fit, slip fit, or press fit depending on the structural interaction of the rods 82 and the shelf members 70. In various embodiments, the support rods 82 may be connected to the upper and lower mounting brackets 86, 90 and caps 94 using fasteners 98, to secure the stack of shelf members 70 together, thereby forming the support column 68. Embodiments where no support rods are utilized are also contemplated, wherein the joints formed between the bosses 110 provide sufficient structural integrity.

As previously described, each of the shelf members 70 are mirror images of one another, having a substantially identical positioning of the rib structures 106 and the bosses 110 on the first and second surfaces 114, 118. For example, to form the "left" support column 68, the shelf members 70 are stacked having the first surface 114 facing upwardly and the second surface facing 118 downwardly. Conversely, to form the "right" support column 69 (FIG. 2), the shelf members 70 are stacked with the second surface 118 facing upwardly and the first surface 114 facing downwardly.

Depicted in FIGS. 9-12, a first shelf member 222 and a second shelf member 226 are arranged directly over one another. Each of the shelf members 222, 226 are oriented to serve as shelves in the left support column 68. As such, the first group of bosses 142 and the first rib structure 166 of the second shelf member 226 are arranged underneath the second group of bosses 146 and the second rib structure 170 of the first shelf member 122. As the first and second shelf members 222, 226 are placed together, the interlocking features 186 of the shelf members 222, 226 fit together thereby forming a two shelf stack 230, depicted in FIG. 10.

Figure 12:
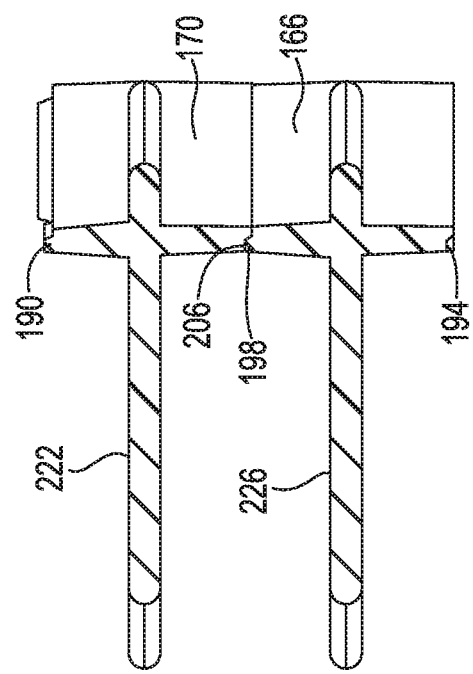
FIG. 12 depicts a cross-sectional view taken at line 12-12 of FIG. 10.
Figure 11:
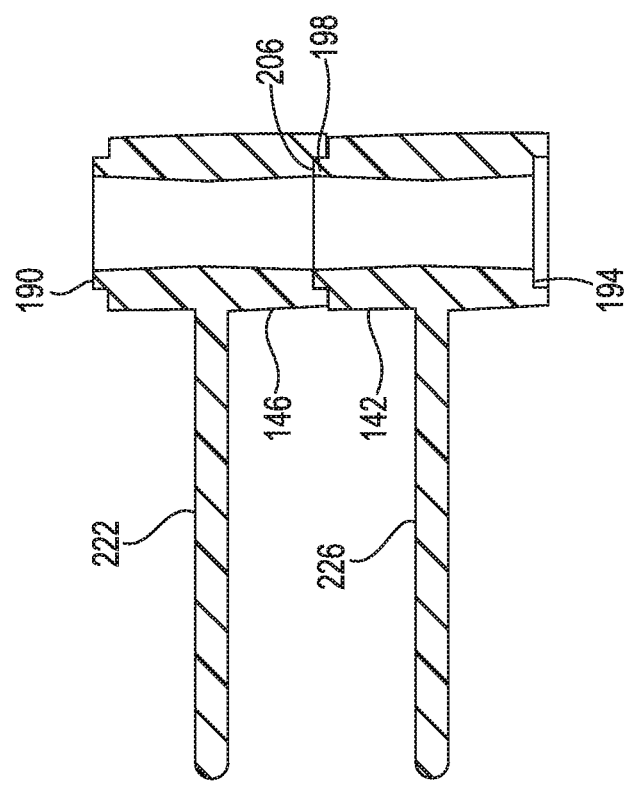
FIG. 11 depicts a cross-sectional view of taken at line 11-11 of FIG. 10.

The annular projection 198 of the first group 142 of bosses 110 fits within the recess 206 of the second group 146 of bosses 110, fitting the two together in an interlocking relationship depicted in FIG. 11. Similarly, the projections 198 and recesses 206 of the first and second rib structures 166, 170 fit together as depicted in FIG. 12.

Figure 13:
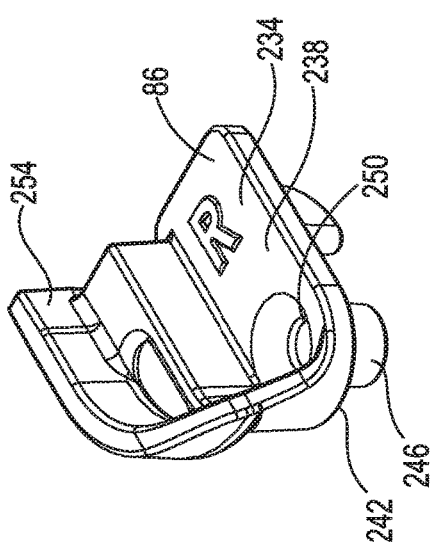
FIG. 13 depicts a perspective view of an upper bracket, according to one or more embodiments of the disclosure.

Referring to FIG. 13 the upper bracket 86 is depicted, according to one or more embodiments of the disclosure. The upper bracket 86 may include a main body portion 234 having an upward facing surface 238 and a downward facing surface 242. The upper bracket 86 may include a support rod inlet 246 on the downward facing surface 242 for receiving a support rod 82 and an aperture 250 in the upward facing surface 238 for securing the support rod 82 and the upper bracket 86 together via a fastener 98 inserted in the aperture 250.

Additionally, the upper bracket 86 may include an alignment feature 254 extended from the upward face surface. In one or more embodiments, the alignment feature 254 is an elongated rib of material extending upwardly from surface 238. In various embodiments, the alignment feature 254 may engage with structural elements of the substrate container 30 (FIG. 1), such as a tongue and groove feature, for alignment of the support columns 68, 69 when mounted within the container 30.

Figure 14B:
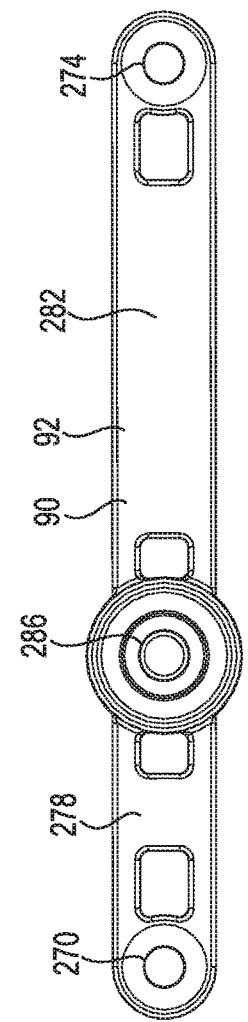
FIGS. 14A-14B depict plan views of lower brackets, according to one or more embodiments of the disclosure.
Figure 14A:
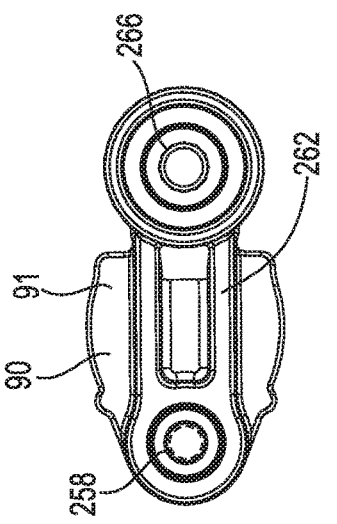
Figure 15A:
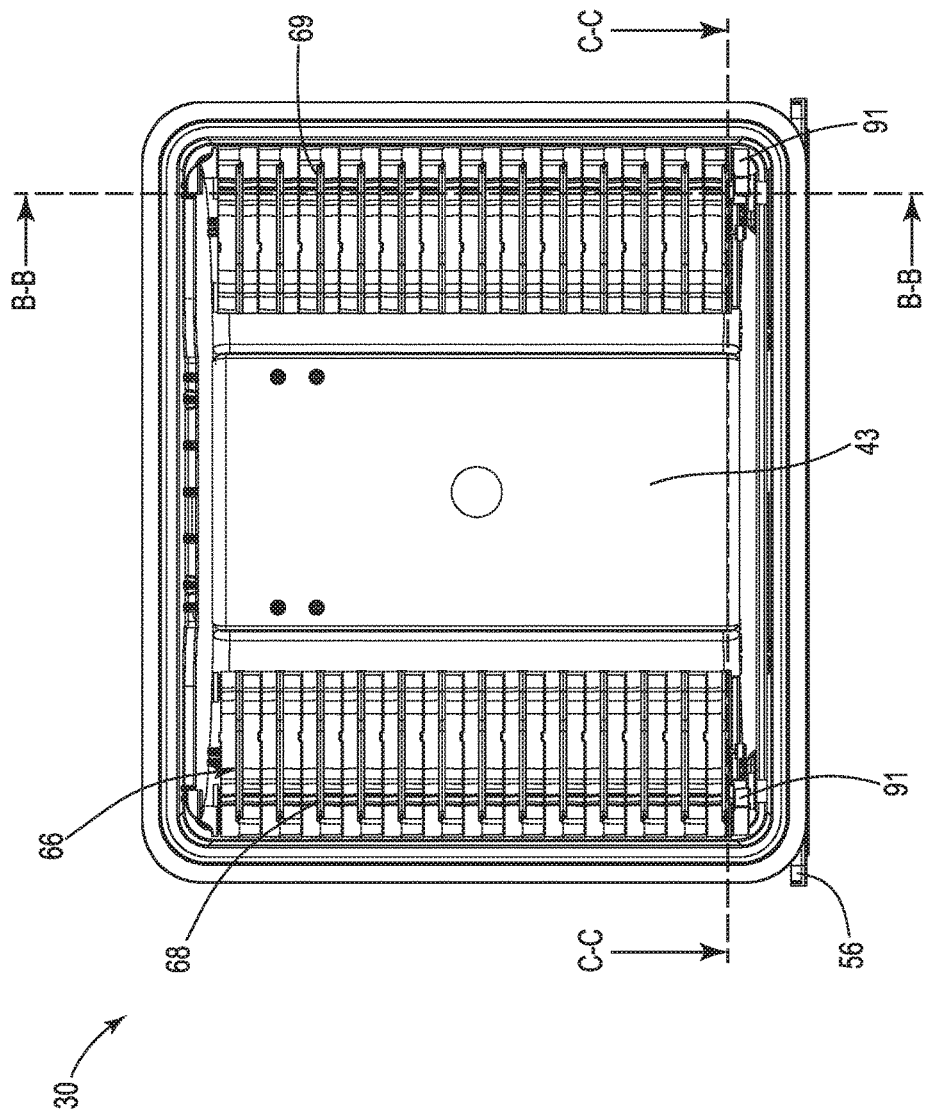
FIG. 15A depicts a front elevational view of a substrate container, according to one or more embodiments of the disclosure.

Referring to FIGS. 14A-14B, the lower brackets 90 are depicted, according to one or more embodiments. In one or more embodiments, the lower brackets 90 include a forward bracket 91 and a rearward bracket 92. The forward bracket 91 may include a support rod inlet 258 for receiving a support rod 82. In certain embodiments, the support rod 82 is held in place by various methods including, but not limited to, a press fit, adhesive, or screw fit. The forward bracket 91 may include an offset portion 262, offsetting a mounting portion 266 from the support rod inlet 258. In various embodiments, the mounting portion 266 is threaded to receive a fastener 98. Similarly, the rearward bracket 92 may include a pair of support rod inlets 270, 274 and offset portions 278, 282 connecting the support rod inlets 270, 274 to the mounting inlet 286.

Referring to FIGS. 15A-16B, in assembly, the support columns 68, 69 may be inserted into the interior 43 of the substrate container 30. Depicted in FIGS. 15B-15C, each of the support columns 68, 69 may be mounted in the interior 43 via the lower brackets 90. The conveyor plate 56 and bottom plate 38 may include various mounting locations 290 for insertion of fasteners 98 into the mounting portion 266 in each of the lower brackets 90. In certain embodiments, these mounting points 290 may be placed in standardized positions for the container 30 and each of the lower brackets 90 adapt the support columns 68, 69 for mounting to the existing mounting locations 290 within the interior of the container 30. As such, each of the lower brackets 90 connect the support rods 82 of the support columns 68, 69 to the various mounting locations 290 via the offset portions 262, 278, 282, described in FIGS. 14A-14B.

Figure 16A:
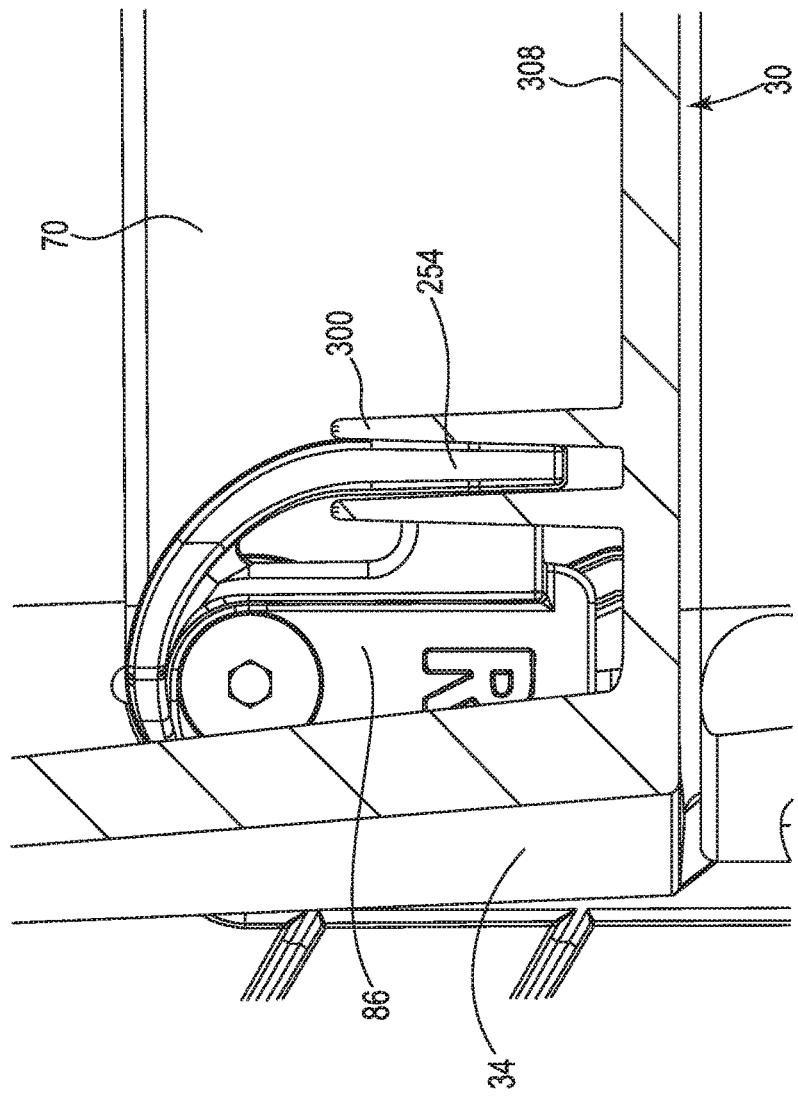
FIG. 16A depicts a cross-sectional view of an upper bracket and a tongue and groove feature in a substrate container, according to one or more embodiments of the disclosure.

For the depicted embodiment of FIGS. 16A-16B, in assembly, as the pre-assembled support columns 68, 69 are inserted rearwardly into the container, the alignment features 254 of the upper bracket 86 and the alignment feature 254 of the shelf member 70 engage with a forward groove feature 300 extending from the interior of the top portion 36 (FIG. 16A), and a rearward groove feature 304 extending from the interior surface 308 of the substrate container 30 (FIG. 16B). Consequently, as the support columns 68, 69 are inserted, the alignment features 254, 182 guide each of the support columns 68, 66 into position for attachment of the lower brackets 90 to the bottom plate 38 of the substrate container 30.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:
1. A substrate support assembly comprising:
   a pair of substrate support columns, each pair of substrate support columns including a stack of a plurality of shelf members and a plurality of support rods inserted through the stack for securing the stack together, each shelf member of the plurality of shelf members including a blade portion having a pair of first and second opposing surfaces and a pair of lengthwise edges extending from a forward portion to a rearward portion of the blade portion and defining an outer periphery and an inner periphery of the blade portion, the blade portion including;
- a first rib structure extending from the first opposing surface and a second rib structure extending from the second opposing surface, the first and second rib structures positioned proximate the outer periphery of the blade portion and extending from the forward portion to the rearward portion of the blade portion;
- a first plurality of bosses extending from the first opposing surface and a second plurality of bosses extending from the second opposing surface, the first and second plurality of bosses positioned proximate the outer periphery of the blade portion, each of the first and second plurality of bosses including a forward boss positioned at the forward portion of the blade portion and a rearward boss positioned at the rearward portion of the blade portion, each of the forward bosses and rearward bosses defining apertures through the shelf member; and
- a first group of interlocking features defined on an edge of the first rib structure and a second group of interlocking features defined on an edge of the second rib structure, the first group of interlocking features including projections and the second group of interlocking features including corresponding recesses for complementary interlocking between adjacent shelf members of the plurality of shelf members;

wherein the stack of the plurality of shelf members includes each of the shelf members stacked with one or more adjacent shelf members via at least one of the first and second rib structures, thereby interlocking each shelf member with the one or more adjacent shelf members of the plurality of shelf members via at least one of the first and second groups of interlocking features, the apertures of the plurality of shelf members being aligned and defining a plurality of channels through the stack for insertion of the plurality of support rods.

2. The substrate support assembly of claim 1, wherein:
the first rib structure extends between the forward boss and the rearward boss of the first plurality of bosses, and the second rib structure extends between the forward boss and the rearward boss of the second plurality of bosses.

3. The substrate support assembly of claim 1, wherein:
the blade portion further includes a first alignment feature defined on the first opposing surface and a second alignment feature defined on the second opposing surface, the first and second alignment features positioned proximate the outer periphery of the blade portion and including a rib extending from the first and second opposing surfaces for engagement with a groove in a substrate container for alignment of the pair of substrate support columns.

4. The substrate support assembly of claim 1, wherein:
the stack of a plurality of shelf members includes a topmost shelf member, the topmost shelf defining an uppermost surface of the stack of the plurality of shelf members; and
the stack of a plurality of shelf members includes an upper bracket connected to the forward boss of the uppermost surface, the upper bracket including a main body portion and an alignment feature extended upwardly from the main body portion, the alignment feature including a rib for engagement with a groove in a substrate container for alignment of the plurality of substrate support columns.

5. The substrate support assembly of claim 4, wherein:
the topmost shelf member and the upper bracket are a unitary structure.

6. The substrate support assembly of claim 1, wherein:
the stack of a plurality of shelf members includes a bottommost shelf member defining a downwardly facing surface; and
the stack of a plurality of shelf members includes a first lower bracket connected to the forward boss of the downwardly facing surface and a second lower bracket connected to the rearward boss of the downwardly facing surface, each of the first and second lower brackets including a support rod inlet connected to an end of one of the plurality of support rods, a mounting portion for connection to a bottom plate of a substrate container, and an offset portion offsetting the mounting portion from the support rod inlet.

7. The substrate support assembly of claim 6, wherein:
the bottommost shelf member and the first and second lower brackets are a unitary structure.

8. The substrate support assembly of claim 1, wherein:
the first and second pluralities of bosses each include an intermediate boss positioned between the forward boss and the rearward boss, the intermediate boss defining an aperture through the shelf member.

9. The substrate support assembly of claim 1, wherein:
each of the first and second opposing surfaces of the plurality of shelf members is a mirror image of one another.

10. The substrate support assembly of claim 1, wherein:
each of the plurality of shelf members is an individually molded piece.

11. A substrate container comprising:
a container portion including two opposing sidewalls, a back sidewall, a top sidewall, and a bottom plate, the container portion defining an opening in a front portion of the substrate container to an interior for containing substrates, the container portion mounted on a conveyor plate;
a door configured for covering and sealing the opening defined by the container portion; and
a pair of substrate support columns mounted the interior for supporting substrates, each of the pair of substrate support columns including a stack of a plurality of shelf members and a plurality of support rods inserted through the stack of the plurality of shelf members for securing the stack of the plurality of shelf members together, each shelf member of the plurality of shelf members including a blade portion having a pair of first and second opposing surfaces and a pair of lengthwise edges extending from a forward portion to a rearward portion of the blade portion and defining an outer periphery and an inner periphery, the blade portion including:
- a first rib structure extending from the first opposing surface and a second rib structure extending from the second opposing surface, the first and second rib structures positioned proximate the outer periphery of the blade portion and extending from the forward portion to the rearward portion of the blade portion;
- a first plurality of bosses extending from the first opposing surface and a second plurality of bosses extending from the second opposing surface, the first and second plurality of bosses positioned proximate the outer periphery of the blade portion and each including a forward boss positioned at the forward portion of the blade portion and a rearward boss positioned at the rearward portion of the blade portion, the forward bosses and rearward bosses defining apertures through the shelf member; and a first group of interlocking features defined on an edge of the first rib structure and a second group of interlocking features defined on an edge of the second rib structure, the first group of interlocking features including projections and the second group of interlocking features including corresponding recesses for complementary interlocking between the two;

wherein the stack of the plurality of shelf members includes each of the shelf members stacked with one or more adjacent shelf members via at least one of the first and second rib structures, thereby interlocking each shelf member with the one or more adjacent shelf members via at least one of the first and second groups of interlocking features, and thereby aligning the apertures of the plurality of shelf members, defining a plurality of channels through the stack for insertion of the plurality of support rods.

12. The substrate container of claim 11, wherein:
the stack of the plurality of shelf members includes a bottommost shelf member defining a downwardly facing surface; and
the stack of the plurality of shelf members includes a first lower bracket connected to the forward boss of the downwardly facing surface and a second lower bracket connected to the rearward boss of the downwardly facing surface, the first and second brackets including a support rod inlet connected to an end of one of the plurality of support rods, a mounting portion connected to the bottom plate of the substrate container, and an offset portion offsetting the mounting portion from the support rod inlet.

13. The substrate container of claim 11, wherein:
the container includes a first groove in the interior of the top sidewall, the first grove positioned proximate the opening of the substrate container;
the stack of the plurality of shelf members includes a topmost shelf member defining an upwardly facing surface; and
the stack includes an upper bracket connected to the forward boss of the upwardly facing surface, the upper bracket including a main body portion and a first alignment feature extended upwardly from the main body portion, the first alignment feature including a rib engaged with the groove in the top sidewall for alignment of the support columns.

14. The substrate container of claim 13, wherein:
the container includes a second groove in the interior of the top sidewall, the second grove positioned proximate the back sidewall of the substrate container; and
the upwardly facing surface includes a second alignment feature, the second alignment feature positioned proximate the outer periphery and including a rib extended from the upwardly facing surface and engaged with the second groove for alignment of the support columns.

15. The substrate container of claim 11, wherein:
the first rib structure extends between the forward boss and the rearward boss of the first plurality of bosses, and the second rib structure extends between the forward boss and the rearward boss of the second plurality of bosses.

16. The substrate container of claim 11, wherein:
the first and second plurality of bosses each include an intermediate boss positioned between the forward boss and the rearward boss, the intermediate bosses defining an aperture through the shelf member.

17. The substrate container of claim 11, wherein:
each of the first and second opposing surfaces of the plurality of shelf members is a mirror images of one another.

18. A method of assembling a substrate container, the method comprising:
inserting a pair of substrate support columns into an interior of a container portion including two opposing sidewalls, a back sidewall, a top sidewall, and a bottom plate, the container portion defining an opening in a front portion of the substrate container to the interior of the substrate container for containing substrates, the pair of substrate support columns each including:
a stack of a plurality of shelf members and a plurality of support rods inserted through the stack of the plurality of shelf members for securing the stack of the plurality of shelf members together, each shelf member of the plurality of shelf members including a blade portion having a pair of first and second opposing surfaces and a pair of lengthwise edges extending from a forward portion to a rearward portion of the blade portion and defining an outer periphery and an inner periphery, the stack of the plurality of shelf members including a bottommost shelf member defining a downwardly facing surface, and the stack of the plurality of shelf members including a first lower bracket connected to the forward portion of the downwardly facing surface and a second lower bracket connected to the rearward portion of the downwardly facing surface, each of the first and second lower brackets including a support rod inlet connected to an end of one of the plurality of support rods, a mounting portion for connection to the bottom plate, and an offset portion offsetting the mounting portion from the support rod inlet; and
mounting each of the pair of substrate support columns to the bottom plate of the container portion via the first and second lower brackets.

19. The method of claim 18, wherein the container portion includes a groove extending from the interior of the top sidewall, and the stack of the plurality of shelf member includes a topmost shelf member defining an upwardly facing surface and includes an upper bracket connected to the forward portion of the upwardly facing surface, the upper bracket including a main body portion and an alignment feature extended upwardly from the main body portion, the alignment feature including a rib for engagement with the groove in the container portion, wherein the method further comprises:
aligning each of the pair of substrate support columns in the interior of the container portion via the alignment feature of the upper bracket.

20. The method of claim 18, wherein the blade portion includes:
a first rib structure extending from the first opposing surface and a second rib structure extending from the second opposing surface, the first and second rib structures positioned proximate the outer periphery of the blade portion and extending from the forward portion to the rearward portion of the blade portion;

a first plurality of bosses extending from the first opposing surface and a second plurality of bosses extending from the second opposing surface, the first and second plurality of bosses positioned proximate the outer periphery of the blade portion and each including a forward boss positioned at the forward portion of the blade portion and a rearward boss positioned at the rearward portion of the blade portion, the forward bosses and rearward bosses defining apertures through the shelf member; and a first group of interlocking features defined on an edge of the first rib structure and a second group of interlocking features defined on an edge of the second rib structure, the first group of interlocking features including projections and the second group of interlocking features including corresponding recesses for complementary interlocking between the first group and second group of interlocking features;

wherein the stack of the plurality of shelf members includes each of the shelf members stacked with one or more adjacent shelf members via at least one of the first and second rib structures, thereby interlocking each shelf member with the one or more adjacent shelf members via at least one of the first and second groups of interlocking features, and thereby aligning the apertures of the plurality of shelf members, defining a plurality of channels through the stack for insertion of the plurality of support rod.

* * * * *